(12) United States Patent
Braunstorfinger

(10) Patent No.: US 9,863,853 B2
(45) Date of Patent: Jan. 9, 2018

(54) MEASURING DEVICE, MEASURING SYSTEM AND METHOD FOR OPERATING A MEASURING SYSTEM WITH RAPID SYNCHRONIZATION OF SETTINGS

(71) Applicant: Rohde & Schwarz GmbH & Co. KG, Munich (DE)

(72) Inventor: Thomas Braunstorfinger, Munich (DE)

(73) Assignee: ROHDE & SCHWARZ GMBH & CO. KG, Munich (DE)

(*) Notice: Subject to any disclaimer, the term of this patent is extended or adjusted under 35 U.S.C. 154(b) by 505 days.

(21) Appl. No.: 14/552,193

(22) Filed: Nov. 24, 2014

(65) Prior Publication Data

US 2015/0346063 A1    Dec. 3, 2015

(30) Foreign Application Priority Data

May 30, 2014 (DE) .......... 10 2014 210 292

(51) Int. Cl.
| | | |
|---|---|---|
| *G01L 15/00* | (2006.01) | |
| *G01M 99/00* | (2011.01) | |
| *H03K 3/01* | (2006.01) | |
| *G01R 13/02* | (2006.01) | |

(52) U.S. Cl.
CPC .......... *G01M 99/00* (2013.01); *G01R 13/029* (2013.01); *G01R 13/0254* (2013.01); *H03K 3/01* (2013.01)

(58) Field of Classification Search
CPC .. H02J 7/025; H02J 5/005; H02J 17/00; H02J 1/14; H02J 3/28; H02J 3/382; H02J 3/383; H02J 3/386; H02J 3/387; H02J 4/00; H02J 50/10; H02J 50/12; H02J 50/23; H02J 50/40; H02J 50/80; H02J 50/09
See application file for complete search history.

(56) References Cited

U.S. PATENT DOCUMENTS

2009/0291688 A1* 11/2009 Uehara ............... H04J 11/0086
                                                                455/436

FOREIGN PATENT DOCUMENTS

DE           100 37 698 A1    2/2002

* cited by examiner

*Primary Examiner* — Roy Y Yi
(74) *Attorney, Agent, or Firm* — Ditthavong & Steiner, P.C.

(57) ABSTRACT

A measuring device comprises a measuring unit and a synchronization unit. In this context, the measuring unit is embodied to implement a measurement task on the basis of first measurement parameters. The synchronization unit is accordingly embodied to synchronize the first measurement parameters with a further measuring device. The measuring device is then embodied to implement the measurement task jointly with the further measuring device on the basis of at least the first measurement parameters.

13 Claims, 2 Drawing Sheets

MEASURING DEVICE, MEASURING SYSTEM AND METHOD FOR OPERATING A MEASURING SYSTEM WITH RAPID SYNCHRONIZATION OF SETTINGS

CROSS-REFERENCE TO RELATED APPLICATION

The present application claims the priority of German patent application DE 10 2014 210 292.8 filed on 30 May 2014, the entire contents of which are herein incorporated by reference.

FIELD OF THE INVENTION

The invention, according to the various embodiments described herein, relates to a measuring device, a measuring system and a method for operating a measuring system in which settings for several measuring devices are implemented in one measuring device and synchronized with all participating measuring devices.

DISCUSSION OF THE BACKGROUND

With conventional measuring devices, the case often occurs that a single measuring device is not sufficient to fulfil a given measurement task. For example, in the case of a signal generator, the number of necessary signal outputs may not be adequate for a desired measurement task. In particular, the limits of individual measuring devices are often reached in the case of measurement tasks with regard to new communications standards, such as LTE, in which different signals of a plurality of antennae must be simultaneously generated or respectively measured.

In order to implement such a measurement task with conventional measuring devices, it is necessary to make the required settings manually in all of the participating measuring devices. This is particularly problematic in the case of any change of the measurement task, since the required settings must be implemented again in every participating measuring device.

Accordingly, it is disadvantageous that a considerable user effort is necessary for the implementation of a measurement task using at least two measuring devices.

SUMMARY OF THE INVENTION

A measuring device, a measuring system and method for operating a measuring system which allows a simple setting of measurement parameters for all participating measuring devices, is provided herein.

A measuring device according to one embodiment comprises a measuring unit and a synchronization unit. In this context, the measuring unit is embodied to implement a measurement task on the basis of first measurement parameters. In another embodiment, the synchronization unit is accordingly embodied to synchronize the first measurement parameters with a further measuring device. The measuring device may be then embodied to implement the measurement task jointly with the further measuring device on the basis of at least the first measurement parameters. Accordingly, the measurement parameters do not need to be input manually into the further measuring device. A significant reduction in user effort is therefore achieved.

Advantageously, according to another embodiment, this measuring device comprises an input unit which may be embodied to input the first measurement parameters. The input unit accordingly comprises a synchronization key. The synchronization unit may be thus embodied to synchronize input first measurement parameters with the further measuring device in the event of an activation of the synchronization key. In this manner, a synchronization of the measurement parameters can be achieved with a very simple operating procedure.

By preference, according to another embodiment, the input unit may be further embodied for the input of second measurement parameters, wherein the second measurement parameters are modifications of the first measurement parameters for the further measuring device. In this context, the measuring device may be configured only with the first measurement parameters. The synchronization unit may be then embodied to synchronize the second measurement parameters with the further measuring device in the event of an activation of the synchronization key. This means that the measuring devices need not be configured with identical measurement parameters. On the contrary, it may be possible to transmit a set of identical measurement parameters—the first measurement parameters—to all measuring devices, and then to transmit modifications for each measuring device as second measurement parameters.

A measuring system according to another embodiment contains a first measuring device as previously described and at least one further measuring device. In this context, the further measuring device also comprises a synchronization unit. The synchronization unit of the first measuring device may be thus embodied to transmit the first measurement parameters to the synchronization unit of the further measuring device. The further measuring device may be accordingly embodied to configure itself on the basis of the first measurement parameters and to implement the measurement task jointly with the first measuring device on the basis of at least the first measurement parameters. This means that, with minimal user effort, the first measuring device and the further measuring device can be configured on the basis of the first measurement parameters.

According to yet another embodiment, by preference in this context, the first measuring device of the measuring system comprises an input unit which may be embodied to input the first measurement parameters. Accordingly, the input unit comprises a synchronization key. In this context, the synchronization unit may be is embodied to synchronize input first measurement parameters with the further measuring device in the event of an activation of the synchronization key.

Furthermore, in this case, the input unit may be preferably embodied to input second measurement parameters, wherein the second measurement parameters are modifications of the first measurement parameters for the further measuring device, and wherein the first measuring device may be configured only with the first measurement parameters. The synchronization unit may be is then embodied to synchronize the second measurement parameters with the further measuring device in the event of an activation of the synchronization key. The synchronization unit of the first measuring device is preferably embodied to transmit the first measurement parameters and the second measurement parameters to the synchronization unit of the further measuring device. The further measuring device may be then preferably embodied to configure itself on the basis of the first measurement parameters and on the basis of the second measurement parameters. The measurement task may be then implemented jointly by the measuring device and the further measuring device on the basis of the first measurement parameters and the second measurement parameters. It is therefore possible to configure the measuring devices differently without generating an increased user effort.

By preference, the synchronization unit of the further measuring device may be embodied, initially, in the event of the synchronization, to implement a synchronization of the first measurement parameters, and following this, a synchronization of the second measurement parameters. Accordingly, the first measurement parameters in the further measuring device are overwritten by the second measurement parameters if the first measurement parameters and the second measurement parameters do not agree. It is therefore possible, in the transmission of the measurement parameters, to manage with a very low transmission volume.

By preference, the further measuring device provides an input unit with a synchronization key. The synchronization unit of the first measuring device and the synchronization unit of the further measuring device may be then embodied, in the event of an activation of the synchronization key of the further measuring device after an activation of the synchronization key of the first measuring device, to synchronize the first measurement parameters or the first measurement parameters and the second measurement parameters. This achieves a further reduction of the user effort, especially in the case of numerous available measuring devices.

By preference, the first measuring device and the further measuring device are connected via a wire-bound or wireless network. Accordingly, the necessary information for the synchronization can be transmitted very simply.

The measurement system preferably may provide a plurality of further measuring devices. The synchronization unit of the first measuring device may be then embodied to synchronize the first measurement parameters or the first measurement parameters and the second measurement parameters with the further measuring devices. The first measuring device may be then embodied to implement the measurement task jointly with the further measuring devices, either only on the basis of the first measurement parameters or on the basis of the first measurement parameters and the second measurement parameters. Accordingly, a large number of measurement tasks can be performed in a flexible manner.

A method according to one embodiment serves for the operation of a measuring system with at least one measuring device and one further measuring device. In this context, first measurement parameters may be set in the first measuring device. Following this, a synchronization of the first measurement parameters may be implemented between the first measuring device and the further measuring device. The first measuring device and the further measuring device implement a measurement task jointly. This means that measuring devices can implement measurement tasks jointly with a very low user effort.

BRIEF DESCRIPTION OF THE DRAWINGS

Various embodiments are described by way of example on the basis of the drawings in which an advantageous exemplary embodiment of the invention is presented. The drawings show.

DETAILED DESCRIPTION

Figure 1:
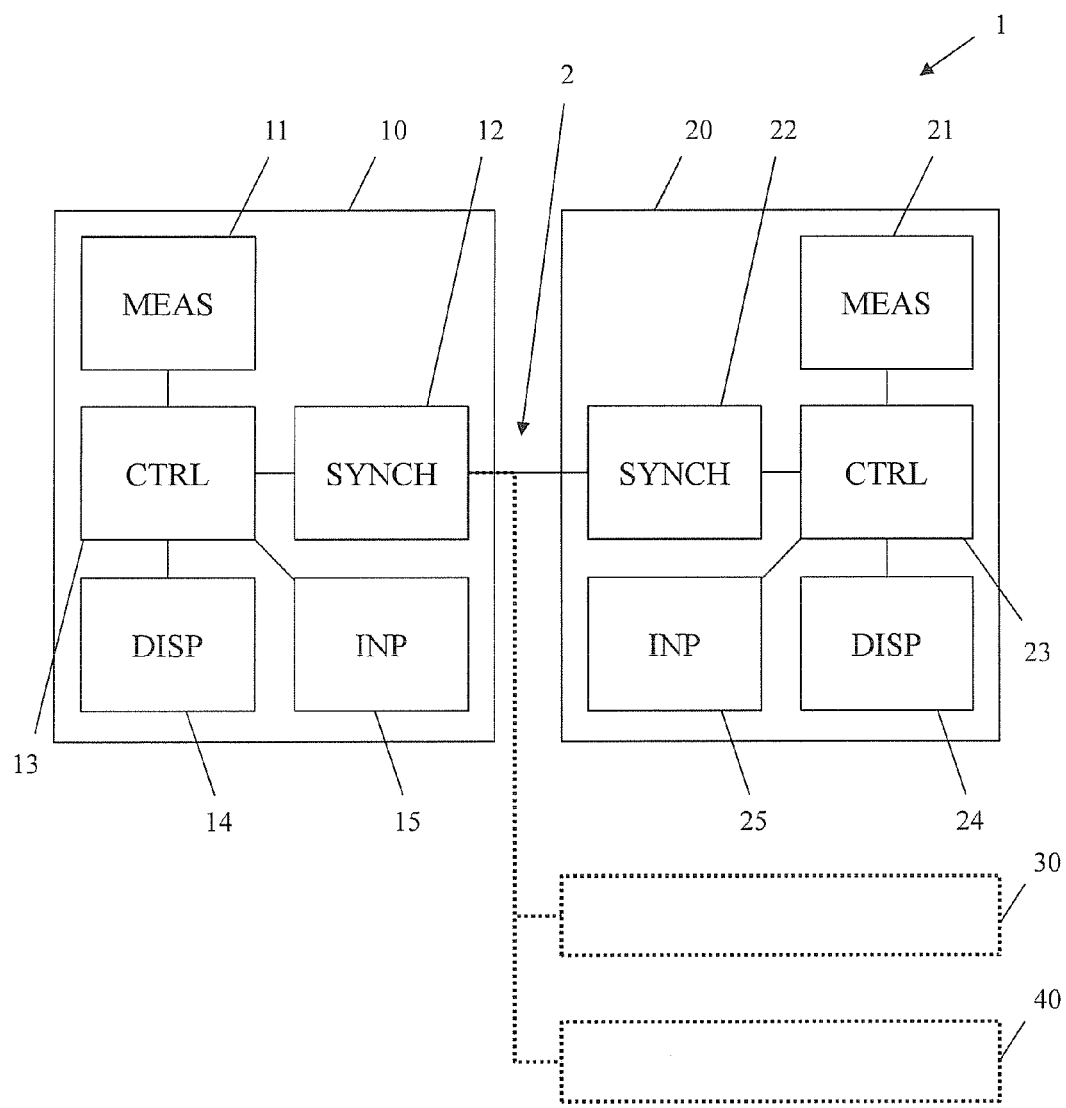
FIG. 1 an embodiment of the measuring system in a block-circuit diagram.

Initially, with reference to FIG. 1, the construction and the functioning of an exemplary embodiment of the measuring device according to one embodiment and of an exemplary embodiment of the measuring system according to one embodiment will be shown. The functioning of an embodiment of the method according to one embodiment will then be explained in detail with reference to FIG. 2. The presentation and description of identical elements in similar drawings has not been repeated in some cases.

FIG. 1 shows an embodiment of the measuring system 1. The measuring system 1 contains a first measuring device 10 and a further measuring device 20. Optionally, the measuring system further comprises further measuring devices 30 and 40.

In this context, the first measuring device 10 comprises a measuring unit 11 which is connected to a control unit 13. The control unit 13 is connected in turn to a synchronization unit 12, a display unit 14 and an input unit 15.

The further measuring device 20 also comprises a measuring unit 21, connected to the latter a control unit 23 and connected to that a synchronization unit 22, a display unit 24 and an input unit 25.

The synchronization unit 12 of the first measuring device 10 is connected by means of a connection 2 to the synchronization unit 22 of the further measuring device 20. In this context, the control units 13, 23 control all of the units 11, 12, 14, 15 and respectively 21, 22, 24, 25 of the measuring devices 10 and respectively 20 connected to them.

The further measuring devices 30, 40 are constructed in a similar manner to the further measuring device 20. These can be identical or different measuring devices. The further measuring devices 30, 40 are also connected to the synchronization unit 12 of the first measuring device 10.

If a joint measurement task of the first measuring device 10 is to be implemented with the further measuring device 20, a user can input the measurement parameters by means of the input unit 15 of the first measuring device 10. Accordingly, on the one hand, the user can input first measurement parameters which are to be used by the first measuring device 10 and also by the further measuring device 20. On the other hand, the user can also input second measurement parameters which are to be used only by the further measuring device 20. In this context, the input is preferably implemented only at the input unit 15 of the measuring device 10. Alternatively, however, inputs can also be implemented at the input unit 25 of the further measuring device 20.

The input measurement parameters are processed by the control unit 13 and transmitted from the synchronization unit 12 of the measuring device 10 by means of the connection 2 to the synchronization unit 22 of the further measuring device 20. In this context, the transmission is preferably implemented as soon as a user at the measuring device 10 has activated a synchronization key which is a part of the input unit 15. By preference, the synchronization can be additionally dependent upon the condition that a synchronization key which is a part of the input unit 25 in the further measuring device 20 has also been activated. This is particularly meaningful if several measuring devices are connected to one another, and measuring devices participating in the measurement task are selected by the activation of the synchronization keys.

After the transmission of the first measurement parameters or respectively of the first measurement parameters and the second measurement parameters to the synchronization unit 22 of the further measuring device 20, these parameters are processed by the control unit 23 and used for the configuration of the further measuring device 20. In this context, a configuration of the further measuring device 20 is initially implemented on the basis of the first measurement parameters. As soon as these settings have been implemented, if second measurement parameters have been transmitted, a configuration is implemented on the basis of the second measurement parameters. In this context, the second measurement parameters overwrite the first measurement parameters if they differ from one another. By preference, however, only measurement parameters which differ from the first measurement parameters are transmitted as second measurement parameters, that is, the second measurement parameters preferably comprise a smaller number than the first measurement parameters. In this manner, transmission volume for the transmission of the second measurement parameters can be saved.

Now, as soon as the first measuring device 10 has been configured with the first measurement parameters, and the further measuring device 20 has been configured with the first measurement parameters or respectively with the first measurement parameters and with the second measurement parameters, the measuring units 11, 21 of the measuring devices 10, 20 jointly implement the measurement task. In this context, the connection 2 can be a wire-bound or wireless connection. In particular, the connection 2 can be a LAN connection or an IEC-BUS connection or a USB connection or a Bluetooth connection or a WLAN connection or a Wi-Fi connection.

If a joint measurement is to be implemented with the further measuring devices 20, 30 and 40, a similar procedure is adopted as in the case of only one further measuring device 20. Initially, first measurement parameters are synchronized with all measuring devices 10, 20, 30, 40. Following this, second measurement parameters are synchronized with each further measuring device 20, 30, 40. In this context, these can be identical for all further measuring devices 20, 30, 40 or, alternatively, can be individually matched for each of the further measuring devices.

Figure 2:
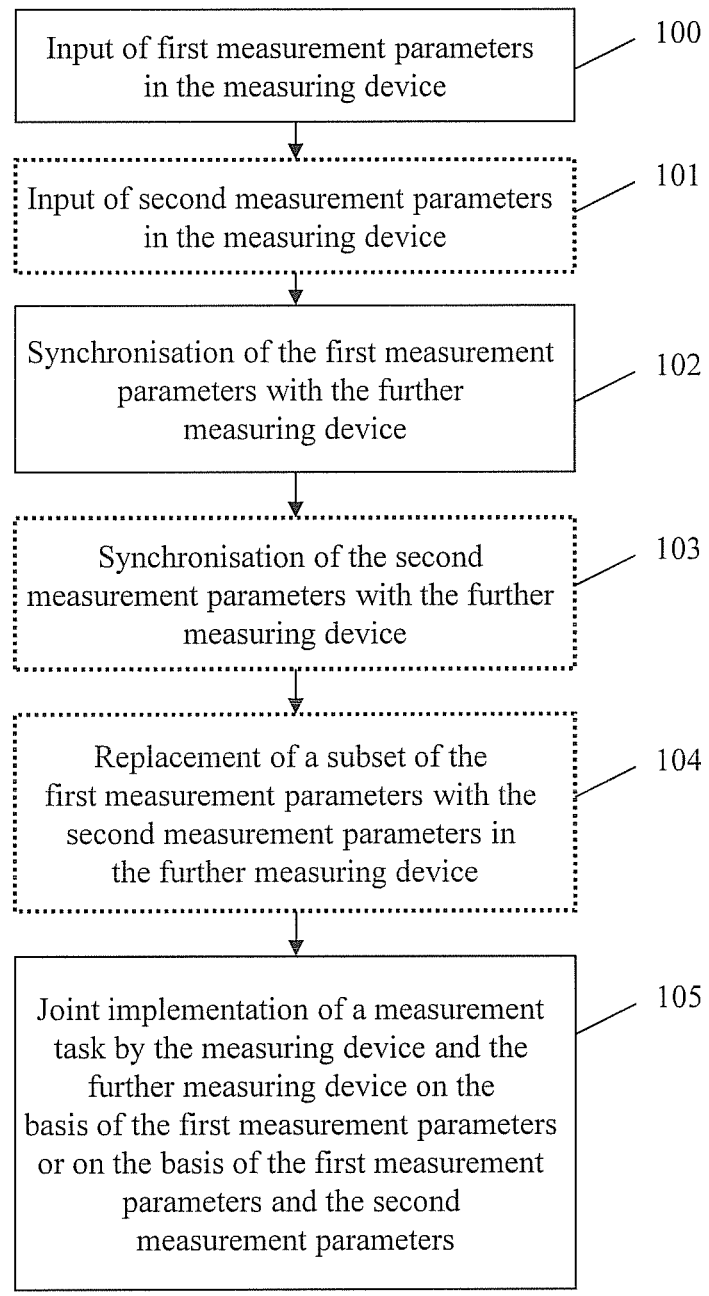
FIG. 2 an embodiment of the method in a flow chart.

FIG. 2 shows an embodiment of the method according to one embodiment for the operation of a measuring system in a flow chart. In a first step 100, an input of first measurement parameters is implemented in a first measuring device 10.

In an optional second step 101, second measurement parameters are input into the first measuring device 10. As already described, the first measurement parameters are measurement parameters which are to be used by all of the measuring devices participating in the measurement task. The second measurement parameters are, as already described, measurement parameters which are to be used only by a further measuring device of the measuring system.

In a third step 102, a synchronization of the first measurement parameters with the further measuring device is implemented. Accordingly, the first measurement parameters are transmitted and set by the further measuring device.

In an optional fourth step 103, a synchronization of the second measurement parameters with the further measuring device is implemented. This step is only implemented if second measurement parameters have been input in the second step 101. In this case, the second measurement parameters are transmitted to the further measuring device.

In a fifth step 104, which is also optional and is only implemented if the second measurement parameters have been input in the second step 101, a subset of the first measurement parameters is replaced by the second measurement parameters in the further measuring device. That is, if second measurement parameters differ from first measurement parameters, the values of the second measurement parameters are used.

In a final, sixth step 105, a measurement task is jointly implemented by the first measuring device 10 and the further measuring device 20. In this context, the first measuring device 10 uses the first measurement parameters, and the further measuring device 20 uses the first measurement parameters and, as required, the second measurement parameters.

As an alternative, the measuring system can comprise two or more further measuring devices. In this case, the first measurement parameters are transmitted to all further measuring devices and used by them. If second measurement parameters are input, these are optionally supplied only to one of the further measuring devices. For each of the further measuring devices, specific, second measurement parameters can be input. In this manner, a different configuration of each individual measuring device is possible with a very low user effort.

The embodiments are not restricted to the exemplary embodiment presented. In particular, extremely diverse measuring devices can be used. For example, network analyzer, logic analyzer, signal generators, oscilloscopes etc. are conceivable. Furthermore, it is possible to use identical or different measuring devices. Advantageously, all of the features described above or illustrated in the drawings or claimed in the claims can be arbitrarily combined with one another.

What is claimed is:

1. A measuring device comprising:
   a measuring unit configured to implement a measurement task on the basis of first measurement parameters;
   a synchronization unit configured to synchronize the first measurement parameters with a further measuring device; and
   an input unit configured to input the first measurement parameters,
   wherein the measuring device is configured to implement a measurement task jointly with the further measuring device on the basis of at least the first measurement parameters,
   wherein the input unit comprises a synchronization key, and
   wherein the synchronization unit is configured to synchronize input of the first measurement parameters with the further measuring device in the event of an activation of the synchronization key.

2. The measuring device according to claim 1, wherein the input unit is configured to input second measurement parameters,
   wherein the second measurement parameters are modifications of the first measurement parameters for the further measuring device, and
   wherein the measuring device is configured only with the first measurement parameters, that the synchronization unit is configured to synchronize the second measurement parameters with the further measuring device in the event of an activation of the synchronization key.

3. A measuring system comprising:
   the measuring device and the further measuring device according to claim 2,
   wherein the synchronization unit of the measuring device is configured to transmit the first measurement parameters and the second measurement parameters to the synchronization unit of the further measuring device,
   wherein the further measuring device comprises a synchronization unit,
   wherein the synchronization unit of the measuring device is configured to transmit the first measurement parameters to the synchronization unit of the further measuring device and the second measurement parameters to the synchronization unit of the further measuring device, and wherein the further measuring device is configured to:
configure itself on the basis of the first measurement parameters and on the basis of the second measurement parameters, and
implement the measurement task jointly with the first measuring device on the basis of the first measurement parameters and the second measurement parameters.

4. A measuring system comprising:
the measuring device and the further measuring device according to claim 1,
wherein the further measuring device comprises a synchronization unit,
wherein the synchronization unit of the measuring device is configured to transmit the first measurement parameters to the synchronization unit of the further measuring device, and
wherein the further measuring device is configured to:
configure itself on the basis of the first measurement parameters, and
implement a measurement task jointly with the measuring device on the basis of at least the first measurement parameters.

5. The measuring system according to claim 3,
wherein the synchronization unit of the further measuring device, in the event of the synchronization, is configured to:
firstly, implement a synchronization of the first measurement parameters, and
secondly, implement a synchronization of the second measurement parameters,
wherein the second measurement parameters overwrite the first measurement parameters if the first measurement parameters and the second measurement parameters do not agree.

6. The measuring system according to claim 4,
wherein the further measuring device comprises an input unit with a synchronization key,
wherein the synchronization unit of the measuring device and the synchronization unit of the further measuring device are configured, in the event of an activation of the synchronization key of the further measuring device after an activation of the synchronization key of the measuring device, to synchronize only the first measurement parameters or the first measurement parameters and the second measurement parameters.

7. The measuring system according to claim 4,
wherein the measuring device and the further measuring device are connected via a wire-bound or wireless connection.

8. The measuring system according to claim 4,
wherein the measuring system contains a plurality of further measuring devices,
wherein the synchronization unit of the measuring device is configured to synchronize the first measurement parameters or the first measurement parameters and the second measurement parameters with the plurality of further measuring devices, and
wherein the first measuring device is configured to implement a measurement task jointly with the plurality of further measuring devices on the basis of the first measurement parameters or on the basis of the first measurement parameters and the second measurement parameters.

9. A method for operating a measuring system with at least one measuring device and a further measuring device, the method comprising:
setting first measurement parameters in the measuring device;
synchronizing the first measurement parameters between the measuring device and the further measuring device; and
jointly implementing a measurement task by the measuring device and the further measuring device,
wherein the synchronizing of the first measurement parameters between the measuring device and the further measuring device includes:
activating a synchronization key of the measuring device,
activating a synchronization key of the further measuring device,
transmitting the first measurement parameters from the measuring device to the further measuring device, and
configuring of the further measuring device on the basis of the first measurement parameters.

10. The method according to claim 9,
wherein the second measurement parameters are set in the measuring device,
wherein the second measurement parameters are modifications of the first measurement parameters for the further measuring device, and
wherein the measuring device is configured only with the first measurement parameters, and
wherein the second measurement parameters are synchronized with the further measuring device.

11. The method according to claim 10,
wherein the measurement task is implemented jointly by the measuring device and the further measuring device on the basis of the first measurement parameters and the second measurement parameters.

12. The method according to claim 10, wherein, in the event of the synchronization:
firstly, implementing a synchronization of the first measurement parameters, and
secondly, implementing a synchronization of the second measurement parameters,
wherein the second measurement parameters overwrite the first measurement parameters if the first measurement parameters and the second measurement parameters do not agree.

13. A method for operating a measuring system with at least one measuring device and a further measuring device, the method comprising:
setting first measurement parameters in the measuring device;
synchronizing the first measurement parameters between the measuring device and the further measuring device; and
jointly implementing a measurement task by the measuring device and the further measuring device,
wherein only the first measurement parameters or the first measurement parameters and the second measurement parameters are synchronized with a plurality of further measuring devices, and
wherein the measurement task is implemented jointly by the measuring device and the plurality of further measuring devices on the basis of the first measurement parameters or on the basis of only the first measurement parameters and the second measurement parameters.

* * * * *